(12) United States Patent
Hung et al.

(10) Patent No.: US 6,430,059 B1
(45) Date of Patent: Aug. 6, 2002

(54) INTEGRATED CIRCUIT PACKAGE SUBSTRATE INTEGRATING WITH DECOUPLING CAPACITOR

(75) Inventors: Chih-Pin Hung, Kaoshiung; Jung-sheng Chiang, Kaohsiung Hsien, both of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/741,610

(22) Filed: Dec. 19, 2000

(30) Foreign Application Priority Data

Aug. 31, 2000 (TW) ..................................... 089117740 A

(51) Int. Cl.7 .................................................. H05K 1/11
(52) U.S. Cl. .................... 361/793; 361/761; 361/830; 361/734; 361/738; 174/266; 174/265
(58) Field of Search ................................. 361/793, 763, 361/764, 766, 761, 780, 794, 799, 808, 830, 502, 690, 713, 718, 734, 738; 174/266, 76, 78, 265, 258

(56) References Cited

U.S. PATENT DOCUMENTS

| 4,921,054 A | * | 5/1990 | Voss et al. .................... 174/255 |
| 5,384,434 A | * | 1/1995 | Mandai et al. ............... 174/258 |
| 5,404,044 A | * | 4/1995 | Booth et al. ................. 257/698 |
| 6,005,197 A | * | 12/1999 | Kola ............................ 174/260 |
| 6,121,554 A | * | 9/2000 | Kamikawa ................... 174/260 |
| 6,153,290 A | * | 11/2000 | Sunahara ..................... 428/210 |

FOREIGN PATENT DOCUMENTS

| GB | 2329073 | * | 3/1999 | ................. 361/792 |

* cited by examiner

Primary Examiner—David S. Martin
Assistant Examiner—Hung Bui
(74) Attorney, Agent, or Firm—J.C. Patents

(57) ABSTRACT

An integrated circuit package substrate. At least one insulating layer is formed between every two neighboring patterned wiring layers for isolation. At least a via is formed to penetrate through the insulating layers to electrically connect the patterned wiring layers. A capacitor is formed within at least one of the insulating layer. The capacitor has two electrodes insulated by a dielectric layer. One of the electrodes is connected to a power source, while the other is connected to ground.

16 Claims, 2 Drawing Sheets

INTEGRATED CIRCUIT PACKAGE SUBSTRATE INTEGRATING WITH DECOUPLING CAPACITOR

CROSS-REFERENCE TO RELATED APPLICATION

This application claims the priority benefit of Taiwan application serial no. 89117740, filed Aug. 31, 2000.

BACKGROUND OF THE INVENTION

1. Field of the Invention

The invention relates in general to an integrated circuit package substrate. More particularly, this invention relates to an integrated circuit package substrate integrating with a decoupling capacitor.

2. Description of the Related Art

Due to the great demand of high density, high integration, multi-function, high performance of integrated circuit package, the semiconductor chip has approached the deep sub-micron regime, and various kinds of high density integrated circuit packages have been developed. For example, the chip scale package (CSP), the multi-chip module (MCM) and the wafer level package have been developed and widely applied in integrated circuit package. The laminated board is made of alternate lamination of multi-layers of patterned wiring layers and insulating layers. As complex and delicate circuits can be formed within the laminated board, it has been commonly used as the carrier for package with high pin counts or high density in the industry of integrated circuit packages.

In FIG. 1, a cross sectional view of a conventional integrated circuit package substrate is shown. The conventional integrated circuit package substrate comprises a laminated board which is laminated by the patterned wiring layers 104a, 104b, 104c, 104d and the insulating layers 102. Between every two patterned wiring layers 104a to 104d, an insulating layer 102 is inserted for isolation. The patterned wiring layers 104a to 104b can be formed by performing photolithography and etching process on a copper coil. The insulating layers 102 are made of glass epoxy such as FR-4, FR-5, bismaleimidetriazine (BT) or epoxy. Several vias 106 are forming through the insulating layers 102 to electrically connect the patterned wiring layers 104a to 104c. The patterned wiring layer 104d on the top surface of the laminated board 100 is patterned into several mounting pad or gold finger 108 as the terminals for connecting a chip. The mounting pads 108 are normally coated with a gold layer 110. Similarly, the patterned wiring layer 104 at on the bottom surface of the laminated board 100 are also patterned into several terminals 114 such as the ball pads of a ball grid array (BGA). Again, these ball pads are normally coated with a gold layer 116. A solder mask layer 112 is formed on both the top and bottom surfaces of the laminated board 100 to cover the patterned wiring layers 104a and 104b, except that the mounting 108 pads and the ball pads 114 are exposed.

For those integrated circuit packages applied to high pin count integrated circuit devices, that is, the devices with many input/output signals and versatile functions such as the bus south bridge, north bridge, accelerated graphics port (AGP) in the computer, a very high electrical performance is demanded. Therefore, a high performance in signal transmission and effective noise elimination are required. In the conventional, structure, one or more decoupling capacitors are added between the power source and the ground to achieve such requirements.

However, by adding the decoupling capacitor between the power source and ground has the following drawbacks:
1. The noise of input/output signal cannot be eliminated.
2. A signal interference is caused by the power and ground bounce between the power source and ground.
3. A signal degradation is easily resulted.
4. Too much excessive gate propagation delay is caused.
5. A malfunction of the system is resulted due to false triggering.

The above drawbacks greatly degrade the performance of the integrated circuits.

There are two ways to improve the electrical characteristics using decoupling capacitors. That is, the decoupling capacitors are disposed in the main board to electrically connect the integrated circuit, or the decoupling capacitors are formed on the package substrate using surface mount technology (SMT) to electrically connect the integrated circuit. Both of these two methods have the natures of high cost, mutual inductance, limitation on capacitor location, occupancy of large area and requirement of SMT for assembling IC package.

SUMMARY OF THE INVENTION

The invention provides an integrated circuit package substrate that integrates with a decoupling capacitor to reduce the noise and signal attenuation, so that the electrical performance can be improved.

The invention provides a laminated board used as an integrated circuit package substrate. The laminated board comprises a plurality of patterned wiring layers alternatively laminated with a plurality of insulating layers. A plurality of vias are formed to penetrate through at least one of the insulating layers to electrically connected the patterned wiring layers insulated by the insulating layers. A capacitor is formed penetrating through the insulating layers. The capacitor further comprises two electrodes, formed at two opposite sides and a dielectric layer formed between the electrodes. One of the electrode is connected to the power source, while the other electrode is connected to ground.

Thus constructed, the invention includes comprises at least the following advantages:
1. The integrated circuit package substrate integrates with a decoupling capacitor, so that the noise and signal attenuation can be minimized, the bouncing signal surge between the power source and the ground and additional transmission delay by can be eliminated. Therefore, the faulty operation caused by the bouncing signal can thus be avoided.
2. As the decoupling capacitor is integrated within the substrate (the laminated board) to avoid the multiple module design. The occupied area can thus be save to reduce the cost and enhance the design and flexibility in design. The overall electrically performance is consequently improved.
3. By integrating the decoupling capacitor, the voltage dropped caused by high frequency can be led to ground without affecting the loading. The harmonic wave component can be greatly reduced. In addition, it can also function as a bypass current can be added between the power source and ground to shorten circuit path of the transient current.

Both the foregoing general description and the following detailed description are exemplary and explanatory only and are not restrictive of the invention, as claimed.

DESCRIPTION OF THE PREFERRED EMBODIMENTS

Figure 1:
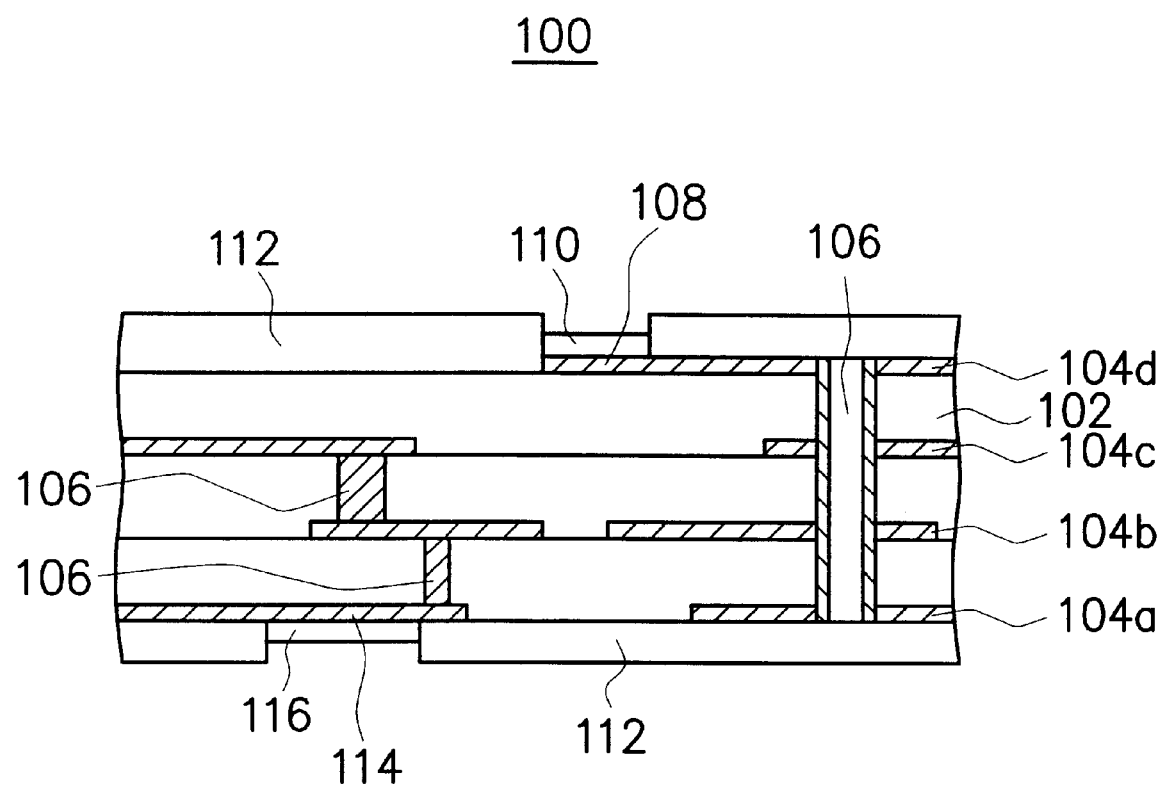
FIG. 1 is a cross sectional view of a conventional integrated circuit package substrate.
Figure 2:
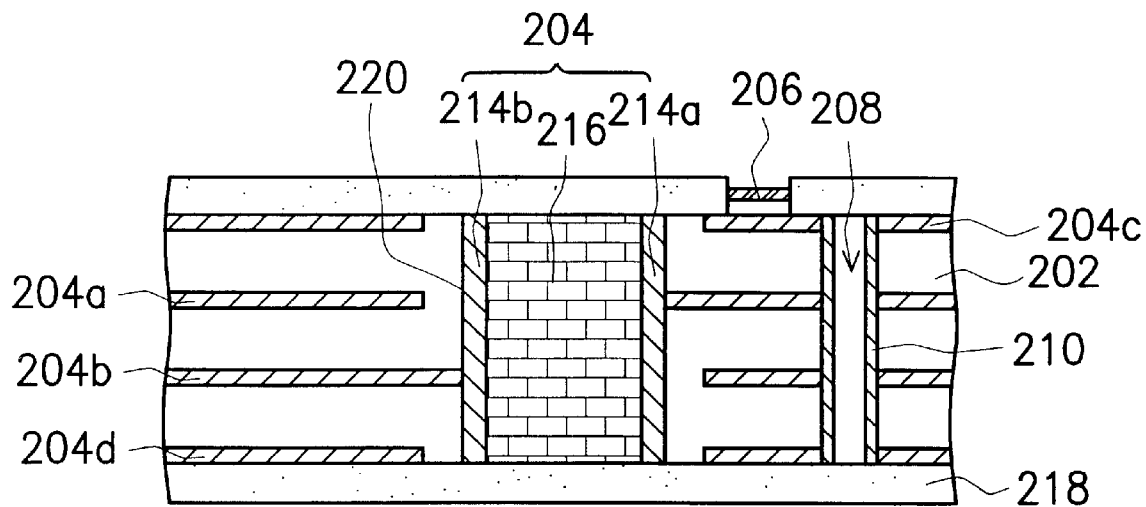
FIG. 2 is a cross sectional view of an integrated circuit package substrate in a first embodiment of the invention.

In FIG. 2, insulating layers 202 are alternately laminated with patterned wiring layers 204a to 204d. Vias 208 are formed through the insulating layers 202 to electrically connect the patterned wiring layers 204a to 204d. The topmost patterned wiring layer 204c comprises several mount pads 206. The material for forming the insulating layers 202 comprises prepreg which is hard and has a high glass transition temperature ($T_g$), for example, glass epoxy (FR4, FR-5) and bismaleimide-trianze (BT). The material for forming the patterned wiring layers 204a to 204d includes copper. The method for forming the patterned wiring layers 204a to 204d includes photolithography and etching process. A gold layer is further coated on the mount pads to improve the adhesion of wire bonding subsequently.

The vias 208 penetrate through the insulating layers 202 and any two of the patterned wiring layers 204a to 204c, or penetrates through the whole laminated board including all the insulating layers 202 and the patterned wiring layers 204a to 204d as shown in FIG. 2. On the sidewall of the vias 208, a coating layer 210, for example, a copper layer, is formed by electroplating to improve the electrical connection to the patterned wiring layers 204a to 204d. The vias 208 further comprise conductive material that fills the vias 208.

In this embodiment, a capacitor 212, for example, a low pass filter decoupling capacitor, is integrated into the laminated board as shown in FIG. 2. The capacitor 212 is formed in a via hole 220 that penetrates through the whole laminated board including all the insulating layers 202 and the patterned wiring layers 204a to 204d. Preferably, the via hole 220 is in a rectangular shape, though other shapes may also be applied in the invention. In FIG. 2, the capacitor 212 comprises two electrodes 214a and 214b on two sidewalls of the via hold 220. Each of the electrodes 214a and 214b is electrically connected to at least one of the patterned wiring layers 204a to 204b. In this embodiment, the electrode 214a is connected to a power source VDD via the patterned wiring layer 204a, while the electrode 214b is connected to ground VSS via the patterned wiring layer 204b. The capacitor 212 further comprises a dielectric layer 216 filling the via hole 220 between the electrodes 214a and 214b. The electrodes 214a and 214b can be made of coating a conductive pase, while the dielectric layer 216 can be made of an insulating paste. Preferably, the capacitor 212 is located under an area for forming a die pad.

The electrode 214a is connected to the power source VDD via the patterned wiring layer 204a, and the electrode 214b is connected to ground VSS via the patterned wiring layer 204b. Therefore, when noise and transient current are generated to flow between the power source and ground by synchronous switch or ground bounce, the connection provides an optimum AC short circuit path between the power source and the ground. As a result, the impedance of signal transmission is reduced to suppress the effect of noise. Furthermore, the noise interference and signal attenuation are minimized to reduce the bounce generated between the power source and the ground and the additional transmission delay. As a result, faulty operation or malfunction for the system caused by bounce signal can be prevented. In addition, by integrating the system, the multiple module design can be avoided to save the occupied area. The fabrication cost is reduced and the designed flexibility and space is enlarged. Moreover, the bouncing caused by high frequency is led to ground without affecting the loading, so that the component of harmonic wave is greatly reduced. It can also function as a bypass current between the power source and the ground to reduce the circuit path of the transient current.

A solder mask layer 218 is then formed on the patterned wiring layers 204c and 204d, while the mount pads 206 are exposed. The material for forming the solder mask layer 218 comprises ultra-violet ray type green paint and thermal curing type green paint. The method for coating the green paint includes roller coating, curtain coating, screen printing, dipping and dry film. For example, when the ultra-violet ray type green paint is used, the green paint is firstly coated on the patterned patterned wiring layers 204c and 204d. After the steps of first bake, exposure, development and second bake, the solder mask layer 218 is formed. Or alternatively, when the thermal curing type green painting is used, the green painted is coated on the patterned wiring layers 204c and 204d followed by a bake step for curing. The solder mask layer 218 is thus formed.

Figure 3:
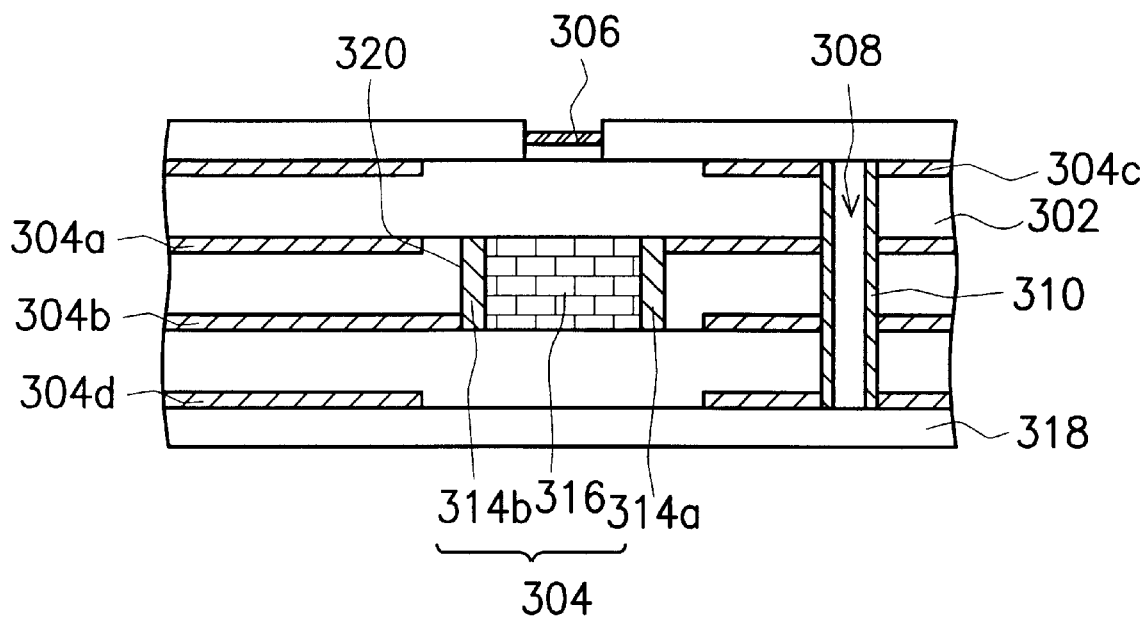
FIG. 3 is a cross sectional view of an integrated circuit package substrate in a second embodiment of the invention.

In FIG. 3, another embodiment of the invention is illustrated. A laminated board is formed of alternatively laminating the insulating layers 302 and patterned wiring layers 304a to 304d. The patterned wiring layers 304a to 304d are electrically connected by the vias 308 that penetrate through the insulating layers 302, or even through the patterned wiring layers 304a to 304d. The topmost patterned wiring layer 304c comprises mount pads 306. Each of the vias 308 comprises conductive coating layers 310 on the sidewall of the via 308 and a conductive material to fill the via 308. Preferably, the conductive coating layers 310 are made of metal such as copper.

Similarly, a capacitor 312 such as a low pass filter decoupling capacitor, is formed in a hole 320 that may penetrate through more than one insulating layer 302. In this embodiment, the hole 320 is formed to penetrate through the middle insulating layer 302. The capacitor 312 has two electrodes 314a and 314b formed on two opposite sidewalls of the hole 320 and a dielectric layer 316 to fill the hole 312 and to insulated the electrodes 314a and 314b.

In this embodiment, the electrode 314a is electrically connected to power source VDD via the patterned wiring layer 304a, and the electrode 314b is electrically connected to the ground via the electrode 304b. The electrodes 314a and 314b are formed by coating a conductive paste on the opposite sidewalls of the hole 320, and the dielectric layer 316 is formed by coating an insulating paste. It is appreciated that capacitor can be formed in a hole penetrating through an insulating layer between any two patterned wiring layers.

As a conclusion, the invention includes comprises at least the following advantages:

1. The integrated circuit package substrate integrates with a decoupling capacitor, so that the noise and signal attenuation can be minimized, the bouncing signal surge between the power source and the ground and additional transmission delay by can be eliminated. Therefore, the faulty operation caused by the bouncing signal can thus be avoided.

2. As the decoupling capacitor is integrated within the substrate (the laminated board) to avoid the multiple module design. The occupied area can thus be save to reduce the cost and enhance the design and flexibility in design. The overall electrically performance is consequently improved.

3. By integrating the decoupling capacitor, the voltage dropped caused by high frequency can be led to ground without affecting the loading. The harmonic wave component can be greatly reduced. In addition, it can also function as a bypass current can be added between the power source and ground to shorten circuit path of the transient current.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. An integrated circuit package substrate, comprising:
   a plurality of patterned wiring layers;
   at least one insulating layer formed between each two neighboring patterned wiring layers to insulate the patterned wiring layers;
   at least one via to penetrate through the patterned wiring layers and the insulating layer in order to electrically connect the pattern wiring layers; and
   a decoupling capacitor penetrated through all the patterned wiring layers and the insulating layer, further comprising:
   two electrodes, each of the electrodes electrically connecting one of the patterned wiring layer; and
   a dielectric layer, formed between the electrodes for insulation.

2. The integrated circuit package substrate according to claim 1, wherein the electrodes are made of conductive paste.

3. The integrated circuit package substrate according to claim 1, wherein the dielectric layer is made of insulating paste.

4. The integrated circuit package substrate according to claim 1, further comprising a die pad area for locating a semiconductor chip, and the decoupling capacitor being located under the die pad area.

5. The integrated circuit package substrate according to claim 1, wherein one of the electrodes is connected to a power source, and the other electrode is connected to ground.

6. The integrated circuit package substrate according to claim 1, wherein the patterned wiring layers comprise copper layers.

7. The integrated circuit package substrate according to claim 1, wherein the insulating layer comprises a bismaleimide-triazine layer.

8. The integrated circuit package substrate according to claim 1, wherein the decoupling capacitor is formed in a rectangular hole within at least one insulating layer.

9. A laminated board used in integrated circuit package, comprising:
   a plurality of patterned wiring layers;
   a plurality of insulating layers, alternatively laminated with the patterned wiring layers for insulating the patterned wiring layers, wherein a plurality of vias are formed to penetrate through at least one of the insulating layers to electrically connected the patterned wiring layers insulated by the insulating layers; and
   a capacitor, penetrating through the insulating layers, the capacitor further comprising:
   two electrodes, formed at two opposite sides; and
   a dielectric layer, formed between the electrodes.

10. The laminated board according to claim 9, wherein the electrodes are made of conductive paste.

11. The laminated board according to claim 9, wherein the dielectric layer is made of insulating paste.

12. The laminated board according to claim 9, wherein a topmost layer of the patterned wiring layers further comprises at least a mount pad as a terminal of a chip.

13. The laminated board according to claim 9, wherein one of the electrodes is connected to a power source, and the other is connected to ground.

14. The laminated board according to claim 9, wherein the mount pad is coated with a gold layer.

15. The laminated board according to claim 9, wherein the capacitor is formed in a rectangular hole within the insulating layers.

16. The laminated board according to claim 9, wherein the topmost layer of the patterned wiring layers is further covered with a solder mask layer.

* * * * *